(12) United States Patent
Shadman et al.

(10) Patent No.: US 8,455,838 B2
(45) Date of Patent: Jun. 4, 2013

(54) MULTIPLE-COLUMN ELECTRON BEAM APPARATUS AND METHODS

(75) Inventors: Khashayar Shadman, Mountain View, CA (US); Robert G. Haynes, Pleasanton, CA (US); Christopher Malcolm Stanley Sears, Fremont, CA (US); Mehran Nasser-Ghodsi, Hamilton, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/532,487

(22) Filed: Jun. 25, 2012

(65) Prior Publication Data

US 2013/0001418 A1      Jan. 3, 2013

Related U.S. Application Data

(60) Provisional application No. 61/502,499, filed on Jun. 29, 2011.

(51) Int. Cl.
*H01J 37/141* (2006.01)
(52) U.S. Cl.
CPC .................................. *H01J 37/141* (2013.01)
USPC ....................................... 250/396 R; 250/310
(58) Field of Classification Search
USPC ............................................. 250/396 R, 310
See application file for complete search history.

(56) References Cited

U.S. PATENT DOCUMENTS

| 5,981,947 | A | 11/1999 | Nakasuji et al. | |
| 6,429,443 | B1 | 8/2002 | Mankos et al. | |
| 6,465,783 | B1 | 10/2002 | Nakasuji | |
| 6,774,646 | B1 * | 8/2004 | Han et al. | 324/754.22 |
| 6,919,952 | B2 | 7/2005 | Kruit | |
| 7,067,809 | B2 * | 6/2006 | Lo et al. | 250/310 |
| 7,214,951 | B2 | 5/2007 | Stengl et al. | |
| 7,391,033 | B1 | 6/2008 | Adler | |
| 7,462,848 | B2 | 12/2008 | Parker | |
| 7,786,454 | B2 | 8/2010 | Parker | |
| 2006/0145097 | A1 | 7/2006 | Parker | |
| 2009/0057577 | A1 | 3/2009 | Parker | |
| 2011/0148297 | A1 | 6/2011 | Yasuda et al. | |

OTHER PUBLICATIONS

PCT International Search Report and Written Opinion of the International Searching Authority for Application No. PCT/US2012/044244, Dec. 26, 2012, 9 sheets.

* cited by examiner

*Primary Examiner* — Kiet T Nguyen
(74) *Attorney, Agent, or Firm* — Okamoto & Benedicto LLP

(57) ABSTRACT

One embodiment disclosed relates an apparatus which includes an electromagnet arranged to provide a large-scale magnetic field in a region. The apparatus further includes an array of multiple electron beam columns formed in the region using an array of bores through magnetic material. Another embodiment relates to a method of generating an array of electron beams. A large-scale magnetic field is generated in a region using at least two magnetic poles. The array of electron beams is generated using an array of columns formed using bores through a magnetic material positioned in the region. Other embodiments, aspects and features are also disclosed.

21 Claims, 5 Drawing Sheets

MULTIPLE-COLUMN ELECTRON BEAM APPARATUS AND METHODS

CROSS-REFERENCE TO RELATED APPLICATION(S)

The present application claims the benefit of U.S. provisional patent application No. 61/502,499, filed Jun. 29, 2011, by inventors Khashayar Shadman et al., the disclosure of which is hereby incorporated by reference in its entirety.

BACKGROUND OF THE INVENTION

1. Field of the Invention

The present invention relates generally to the generation of multiple electron beams and the use thereof.

2. Description of the Background Art

Electron beam instruments include tools used in automated inspection and review of manufactured substrates. Electron beam instruments also include electron beam lithography systems, and other instruments that use electron beam technology.

Single electron beam systems require very high beam currents to achieve desired throughput at high resolution, therefore are slow when used for applications such as high-resolution inspection of manufactured substrates. A multi-beam system with N beams may provide for N times improvement in throughput (speed) of an inspection system. Single electron beam systems do not, inherently, suffer from cross talk between adjacent electron-optical columns, whereas a parallel system must address cross talk between adjacent columns.

Previous instruments producing multiple electron beams generally utilize purely electrostatic elements. However, these previous instruments are typically prone to substantial aberrations.

SUMMARY

One embodiment disclosed relates an apparatus which includes an electromagnet arranged to provide a large-scale magnetic field in a region. The apparatus further includes an array of multiple electron beam columns formed in the region using an array of bores through magnetic material.

Another embodiment relates to a method of generating an array of electron beams. A large-scale magnetic field is generated in a region using at least two magnetic pole pieces (poles). The array of electron beams is generated using an array of columns formed using bores through a magnetic material positioned between in the region.

Another embodiment relates to an array of electron beam columns. The array of electron beam columns is formed using magnetic material positioned in a large-scale magnetic field. An array of bores is provided through the magnetic material. An array of electron sources is provided such that each source is configured to emit electrons into one end of a corresponding bore. In addition, multiple electrodes are arranged within each bore.

Other embodiments, aspects and features are also disclosed.

DETAILED DESCRIPTION

The present disclosure provides an innovative design which converts a large-scale (global) magnetic field into multiple lensing fields used by the array of columns to focus many electron beams simultaneously without crosstalk. The large-scale magnetic field is generated so as to be substantially homogeneous over a region within which the multiple electron beams are to be generated.

As disclosed herein, the multiple lensing fields may be produced by immersing a magnetic block of material with an array of bores through it into the large-scale magnetic field. The locations of the bores define the locations of the columns. The large-scale B-field decays as it enters the bores from either end, thereby producing two lenses—one at the end towards the source, and one at the end towards the target substrate. In addition, the B-field effectively contains the secondary electrons emitted from the wafer, allowing them to be swept back up each of the columns so as to be detected. Signal contamination due to electron spillage to adjacent columns is negligible.

The electrostatic elements in each column provide the capability to raster the electron beam with varying landing energies and extraction fields for various inspection use cases. The scanning among the columns may be synchronous and may be performed along a single direction, normal to the stage travel direction, so as to cover the wafer area in swaths.

Figure 1:
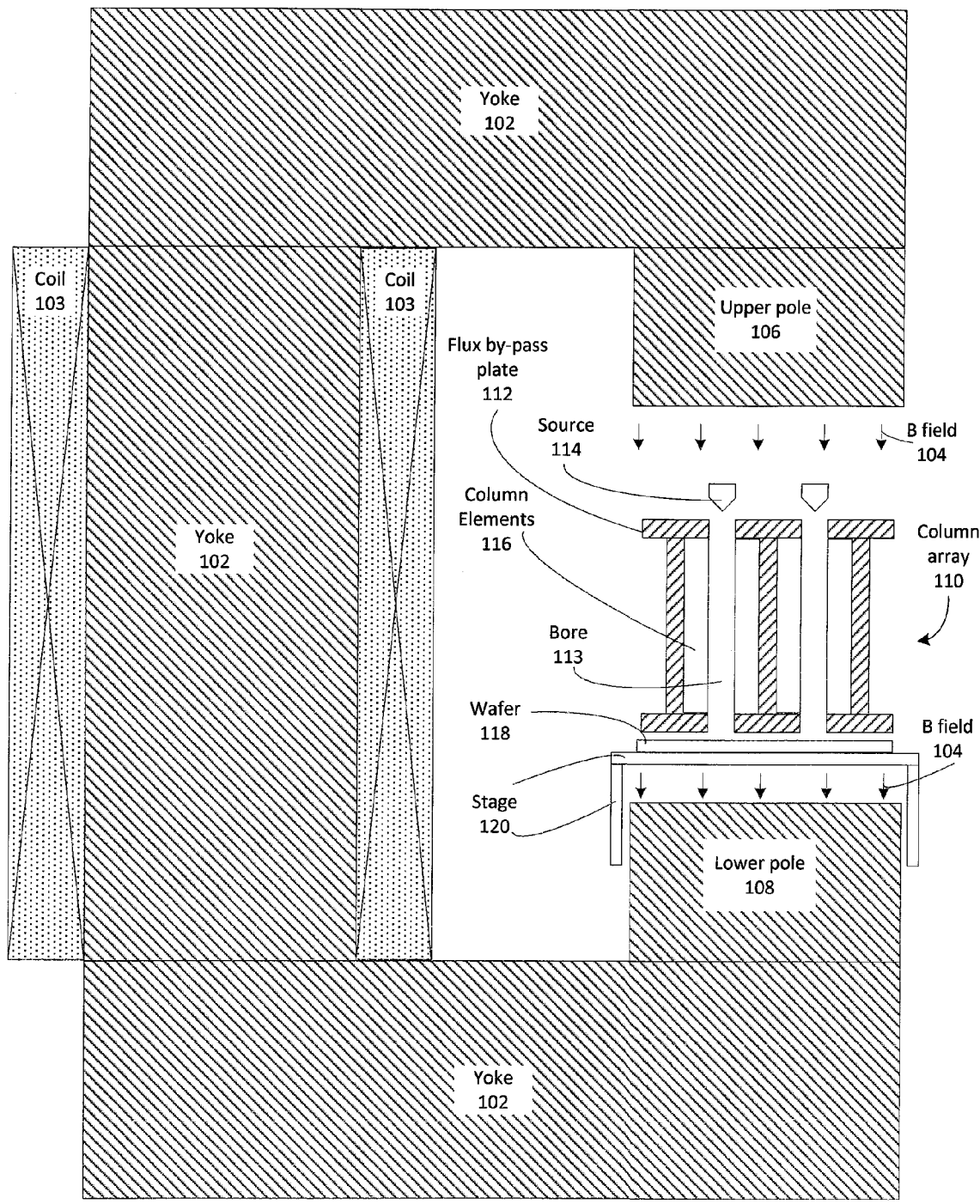
FIG. 1 is a cross-sectional diagram of a multiple-column electron beam apparatus in accordance with an embodiment of the invention.

FIG. 1 is a cross-sectional diagram of a multiple-column electron beam apparatus 100 in accordance with an embodiment of the invention. The apparatus 100 includes an electromagnet for the large-scale (global) magnetic circuit. The electromagnet may include a conductive coil 103 wound around a magnetic yoke 102 and may be configured to produce a large-scale, magnetic field (B field) 104 in a region between an upper magnetic pole piece (pole) 106 and a lower magnetic pole piece (pole) 108. Note that one position of the conductive coil 103 about the yoke 102 is depicted in the embodiment shown in FIG. 1. The conductive coil 103 may be arranged at other positions in alternate embodiments.

The large-scale B field 104 is configured to be homogeneous (uniform) in the region between the upper and lower poles (106 and 108) without the presence of the multiple-column array 110. The multiple-column array 110 may be arranged within the region of the large-scale B field 104.

The multiple-column array 110 may be formed using a magnetic flux by-pass plate 112 with multiple bores 113 that perturb the large-scale B field 104 so as to produce lensing fields for each of the columns in the array 110. The lensing fields are formed at both of the ends of each bore 113 due to the decay of the large-scale B field 104 as it enters each end of each bore 113. The flux by-pass plate 112 may be made of magnetic steel, for example.

The flux by-pass plate 112 may be a single monolithic plate. Alternatively, the flux by-pass plate 112 may be formed using two plates (upper and lower) to allow applying different voltages to the upper and lower portions. As another alternative, the flux by-pass plate 112 may be divided in the x-y (horizontal) dimensions to allow adjusting the voltage on each individual bore 113.

Further components are included so as to use each bore 113 as a micro-column for the generation and focusing of an individual electron beam. These components include an electron source 114 and multiple column elements 116 arranged to be adjacent to each each bore 113. An exemplary implementation of these components is described below in relation to the embodiment of an individual micro-column depicted in FIG. 2.

The column array 110 is configured to individually focus the multiple electron beams onto the surface of a semiconductor wafer 118 (or reticle, or other substrate) positioned below the bottom end of the bores 113. The column array 110 may include a two-dimensional array of electron beam columns, where each column may be formed by arranging appropriate components in and about a bore 113.

The target wafer (or other manufactured substrate, such as a reticle or mask) 118 may be held by a movable stage 120. In FIG. 1, the stage 120 may be configured to move the wafer 118 under the column array 110 in the direction perpendicular to the plane of the page. In an exemplary implementation, the stage 120 may be configured to use cross-roller bearings to be movably supported above the lower yoke 108, and the height of the stage 120 above the lower yoke 108 may be adjustable.

Figure 2:
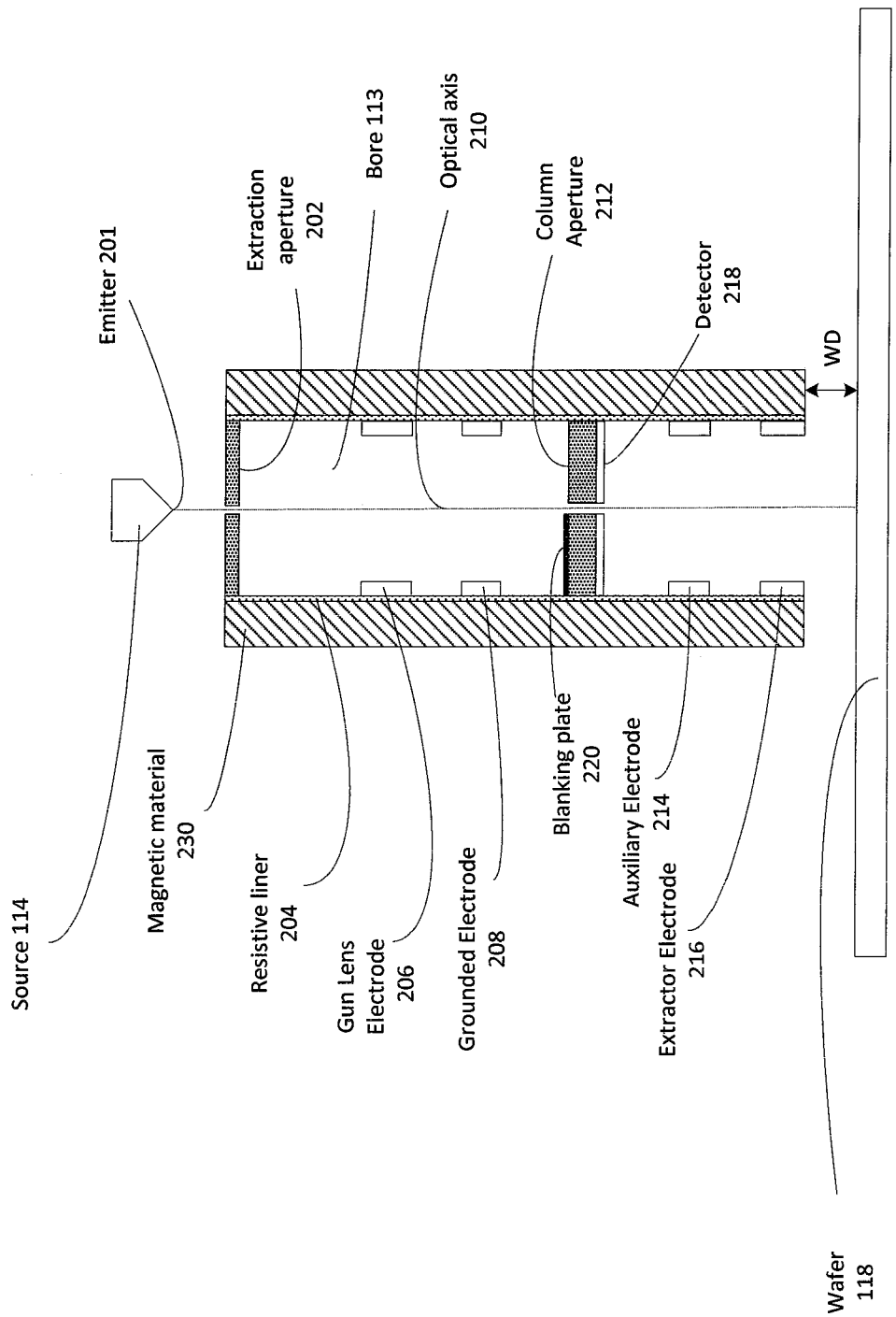
FIG. 2 is a cross-sectional diagram of a single microcolumn formed within a flux by-pass plate in accordance with an embodiment of the invention.

FIG. 2 is a cross-sectional diagram of a single micro-column formed within magnetic material 230 in accordance with an embodiment of the invention. The magnetic material 230 may be that of a flux by-pass plate 112 per the embodiment of FIG. 1 or may be that of a pole piece 302 per the embodiment of FIG. 3 (described below). The micro-column may be configured to generate an electron beam that travels down the bore 113 along the optical axis 210 of the column. As shown, the components of the micro-column may include an emitter 201, an extraction aperture 202, a resistive liner 204, a gun lens electrode 206, a grounded electrode 208, a column aperture 212, one or more auxiliary electrodes 214, and an extractor electrode 216.

In one embodiment, the bore 113 through the magnetic material 230 may be cylindrical and may be 9.5 mm in length and 0.5 mm in diameter. Other bore dimensions may be implemented in other embodiments. Note that the bore 113 need not be symmetric in that it may have different entrance and exit hole sizes.

The electron source 114 may have an emitter 201 to which is applied a highly negative voltage Vemitter. The extraction aperture 202 may comprise an electrode with an opening therein and may have a voltage Vextractor applied thereto that is positive relative to Vemitter so as to extract electrons from the emitter 201. The extractor voltage may be set to provide the desired current and angular intensity of extracted electrons.

The resistive liner 204 may be arranged around the bore 113. The resistive liner 204 may be used to shield the field of the electrodes (202, 206, 208, 214 and 218) from the potential on the magnetic material 230.

The voltage on the magnetic material 230 may be set to a potential determined by the mode of operation. In one implementation, the voltage on the magnetic material 230 may be set so as to act as a suppressor for charge control at the target wafer (or other manufactured substrate) 118.

The gun lens electrode 206 may comprise one or multiple electrodes arranged around a portion of the bore 113 in the upper column. The gun lens electrode 206 may have a voltage Vgun applied to it so as to condense the electrons into an electron beam.

The grounded electrode 208 may be arranged around a portion of the bore 113 beneath the gun lens electrode 206. The grounded electrode 208 may be conductively connected to an electrical ground of the apparatus. As such, the grounded electrode is at a potential that is |Vemitter| higher (more positive) than the emitter 201. Hence, the electrons of the electron beam traveling down the optical axis 210 of the micro-column will have an energy of approximately e|Vemitter| as it passes by the grounded electrode 208. The grounded electrode 208 may also function as a centering deflector which acts to center the electron beam through the column aperture 212.

For example, Vemitter may be negative 3 kilovolts (3 kV) such that the beam energy e|Vemitter| would be three kilo electron volts (3 keV). Other beam energies may be generated by applying different voltages to the emitter. The gun lens electrode 206 and the grounded electrode 208 may be spaced apart in order to maintain inter-electrode fields between the electrodes (206 and 208) below a threshold field strength. In one embodiment, for example, if the potential difference between the electrodes (206 and 208) is approximately 3 kV, then in order to maintain the inter-electrode fields below a threshold field strength of 4 kV/mm, the electrodes (206 and 208) would be spaced apart by at least 0.75 mm since 3 kV/0.75 mm=4 kV/mm. In other embodiments, the inter-electrode fields may be maintained below other threshold field strengths by appropriate electrode spacing.

The column aperture 212 may be arranged around the optical axis 210 below the grounded electrode 208. The column aperture 212 separates the upper column which includes components relating to the electron gun from the lower column which includes components relating to beam deflection and the magnetic objective lens.

The auxiliary electrode(s) 214 may comprise one or multiple electrodes arranged around a portion of the bore 113 beneath the column aperture 212. In one implementation, two auxiliary electrodes 214 may be used in each bore 113. The resistive liner 204 may be used to shield the field of the auxiliary electrode(s) 214 from the potential on the flux by-pass plate 112. The auxiliary electrode(s) 214 may function as a first electrostatic component to which an appropriate voltage may be applied to reduce aberrations in the electron beam.

The extractor electrode 216 may comprise one or multiple electrodes arranged around a portion of the bore 113 beneath the auxiliary electrode(s) 214. The resistive liner 204 may be used to shield the field of the extractor electrode 216 from the potential on the pole piece of the central yoke 112. The extractor electrode 216 may function as a second electrostatic component to which an appropriate voltage may be applied to reduce aberrations in the electron beam. In one embodiment, the auxiliary electrode(s) 214 and the extractor electrode 216 may be spaced apart so as to maintain an inter-electrode field strength below the threshold field strength described above.

The manufactured substrate 118 may be arranged to be a distance WD below the magnetic material 230 which surrounds the bottom end of the bore 113 that defines the micro-column. In one embodiment, WD is sufficiently long so as maintain the field strength between the magnetic material 230 and the manufactured substrate 118 below the threshold field strength described above.

As described above in relation to FIG. 1, the magnetic material 230 and the manufactured substrate 118 are immersed in the large-scale B field 104. The presence of the magnetic material 230 which surrounds the bottom end of the bore 113 within the large-scale B field 104 causes the large-scale B field 114 to effectively decay as it approaches the bottom end of the bore 113. The resultant B field effectively forms an objective magnetic lens which focuses the electron beam onto the surface of the wafer 118.

In one embodiment, the micro-column may be configured for use for electron beam imaging. In this case, a detector 218 may be provided in the micro-column. The detector 218 may be implemented as a PIN diode detector and may be positioned beneath the column aperture 212. In this embodiment, the resultant B field which forms the objective magnetic lens also acts to contain secondary electrons emitted from the wafer 118. This allows the secondary electrons to pass back up through the bore 113 of the micro-column towards the detector 218.

In another embodiment, the micro-column may be configured for use for electron beam lithography. In this case, a blanking plate 220 may be provided in the micro-column. The blanking plate 220 may be electronically actuated to cover the column aperture 212 so as to controllably block (blank) the electron beam. Each blanking plate shall be positioned so that the blanking step does not induce a beam position shift at the image (litho) plane. (This specific function is called Conjugate Blanking.) Each blanking plate 220 in the apparatus may be individually controllable so as to control individual pixels being written by the electron beam lithography instrument.

Figure 3:
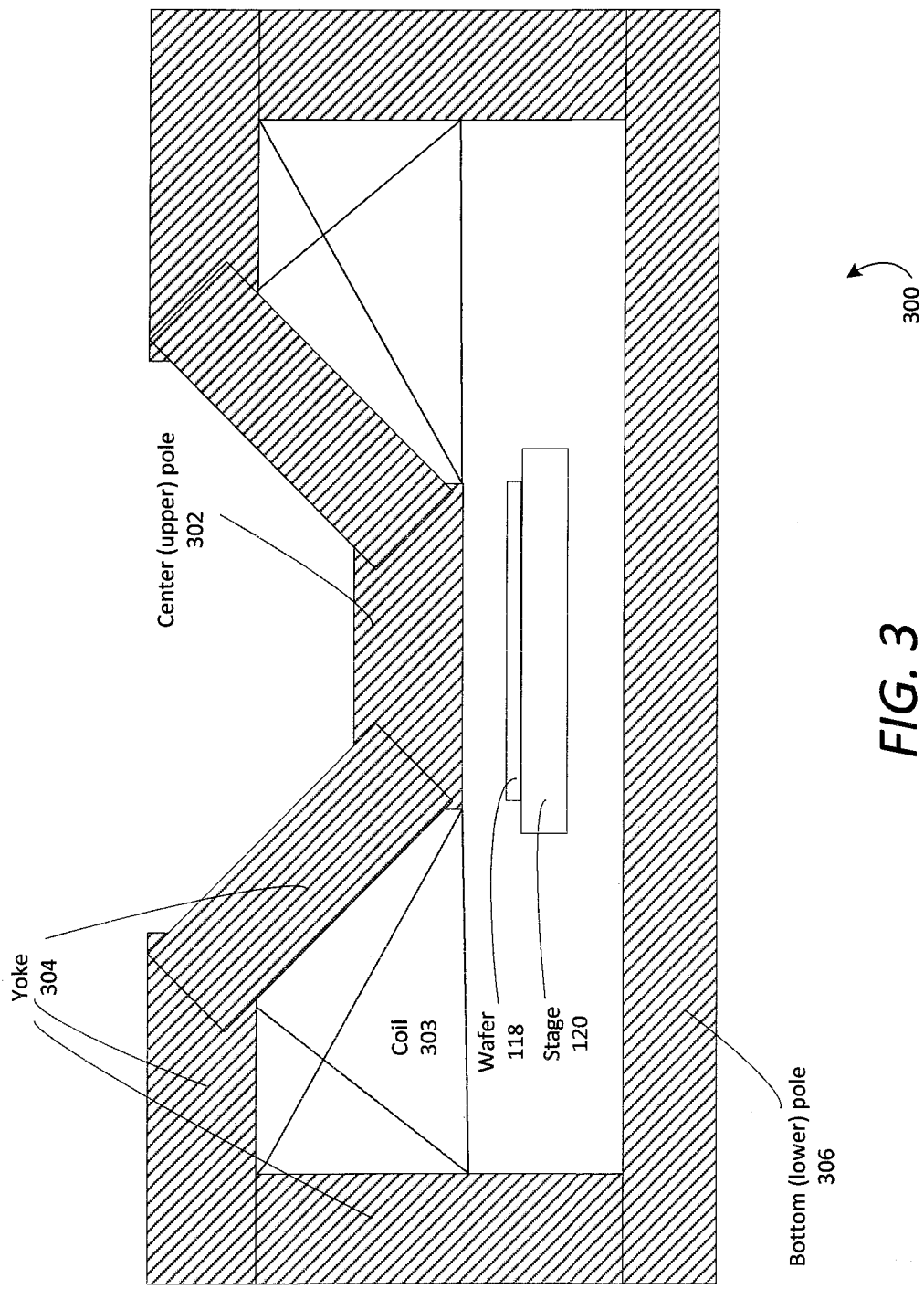
FIG. 3 is a cross-sectional diagram of an alternate configuration of a multiple-column electron beam apparatus in accordance with an embodiment of the invention

FIG. 3 is a cross-sectional diagram of an alternate configuration of a multiple-column electron beam apparatus 300 in accordance with an embodiment of the invention. As shown, compared with the apparatus 100 in FIG. 1, the apparatus 300 in FIG. 3 has a different arrangement of pole pieces for the electromagnet which generates the large-scale magnetic field.

As depicted, the pole pieces include a center (upper) pole piece 302, yolk 304, and bottom (lower) pole piece 306. The micro-columns described above in relation to FIG. 2 are embedded in the center pole piece 302. As such, the center pole piece 302 in FIG. 3 provides similar functionalities as both the upper pole piece 106 and the magnetic by-pass plate 112 in FIG. 1. A coil 303 about the center pole piece 302 provides excitation for the electromagnet.

Figure 4:
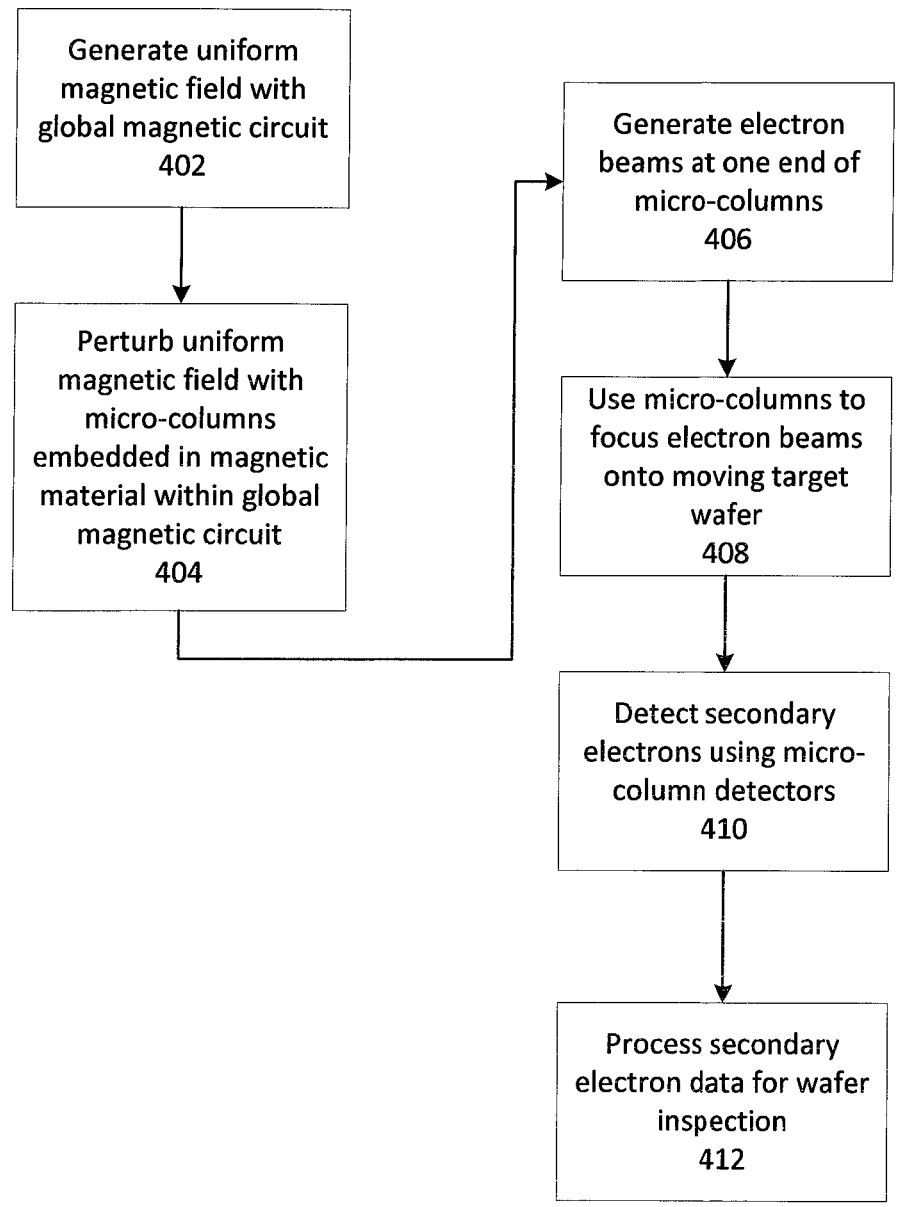
FIG. 4 is a flow chart of a method of automated inspection in accordance with an embodiment of the invention.

FIG. 4 is a flow chart of a method 500 of automated inspection in accordance with an embodiment of the invention. The method 400 of FIG. 4 may be implemented using the apparatus described above, for example.

Per block 402, a uniform magnetic field may be generated with a global magnetic circuit. Per block 404, the uniform magnetic field may be perturbed with micro-columns embedded in magnetic material within the global magnetic circuit. The magnetic material may be, for example, a flux by-pass plate as described above in relation to FIG. 1 or a pole piece as described above in relation to FIG. 3.

Subsequently, electron beams are generated at one end of the micro-columns per block 406, and the micro-columns are used to focus the electron beams onto a moving target wafer (or other manufactured substrate) per block 408.

Per block 410, secondary electrons may then be detected using detectors embedded in the micro-columns. Finally, per block 412, the secondary electron data may be processed for the purpose of inspecting the wafer for defects.

Figure 5:
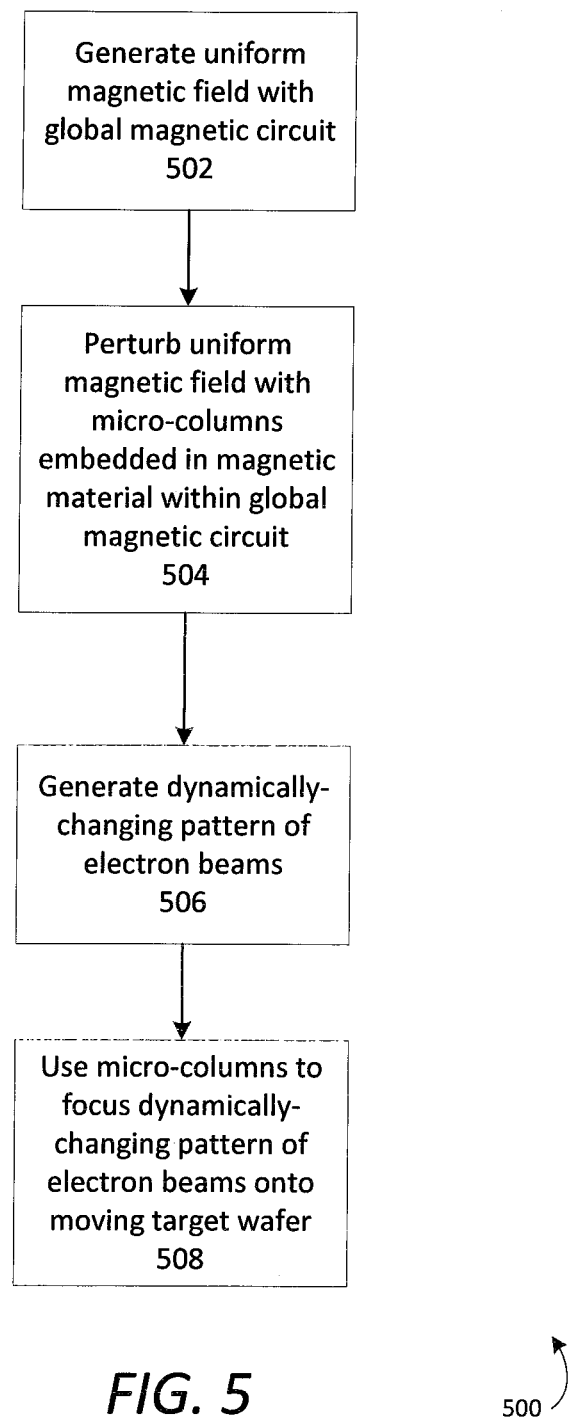
FIG. 5 is a flow chart of a method of electron beam lithography in accordance with an embodiment of the invention.

FIG. 5 is a flow chart of a method 500 of electron beam lithography in accordance with an embodiment of the invention. The method 500 of FIG. 5 may be implemented using the apparatus described above, for example.

Per block 502, a uniform magnetic field may be generated with a global magnetic circuit. Per block 504, the uniform magnetic field may be perturbed with micro-columns embedded in magnetic material within the global magnetic circuit. The magnetic material may be, for example, a flux by-pass plate as described above in relation to FIG. 1 or a pole piece as described above in relation to FIG. 3.

Per block 506, a dynamically-changing pattern of electron beams may be generated using blanking plates for the micro-columns. Finally, per block 508, the micro-columns may be used to focus the dynamically-changing pattern of electron beams onto a moving target wafer.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus comprising:
   an electromagnet arranged to provide a large-scale magnetic field in a region; and
   an array of multiple electron beam columns formed in the region using an array of bores through magnetic material.

2. The apparatus of claim 1, wherein the region is between at least two magnetic pole pieces of the electromagnet.

3. The apparatus of claim 2, wherein the array of bores goes through a flux by-pass plate between said at least two magnetic pole pieces.

4. The apparatus of claim 1, further comprising:
   first and second pole pieces of the electromagnet, wherein the array of bores goes through the first pole piece.

5. The apparatus of claim 1 further comprising:
   a movable stage configured to hold a wafer, Mask, EUV mask, or other flat substrates with substantially limited thickness beneath the array of multiple electron beam columns.

6. The apparatus of claim 1, wherein an electron beam column of the multiple electron beam columns comprises multiple electrodes formed within a bore.

7. The apparatus of claim 6, wherein the electron beam column comprises an electron source including an emitter and an extraction aperture having a voltage applied thereto so as to extract electrons from the emitter.

8. The apparatus of claim 6, wherein the electron beam column further comprises a resistive liner between the bore and the multiple electrodes.

9. The apparatus of claim 6, wherein the electron beam column further comprises:
   a column aperture separating an upper portion of the column from a lower portion of the column, wherein the multiple electrodes include a gun lens electrode and a grounded electrode in the upper portion of the column, wherein the gun lens electrode is configured to condense electrons into an electron beam, and wherein the grounded electrode is configured to center the electron beam so that the electron beam travels through the column aperture.

10. The apparatus of claim 9, wherein the multiple electrodes further include at least one auxiliary electrode and an extractor electrode in the lower portion of the column, further wherein the at least one auxiliary electrode is configured to provide a first deflection of the electron beam, and the extractor electrode is configured to provide a second deflection of the electron beam.

11. The apparatus of claim 9, wherein the electron beam column further comprises a detector which is configured to detect secondary electrons and configured to define the beam through limiting divergent beam traces.

12. The apparatus of claim 9, wherein the electron beam column further comprises a blanking plate which is configured to be actuated to block the electron beam from entering the lower portion of the column.

13. A method of generating an array of electron beams, the method comprising:

generating a large-scale magnetic field in a region using at least two magnetic poles; and generating an array of electron beams using an array of columns formed using bores through a magnetic material positioned in the region.

14. The method of claim 13, wherein an electron beam of the array of electron beams is generated using multiple electrodes formed within a bore through the magnetic material.

15. The method of claim 13 further comprising:
holding a manufactured substrate beneath the array of columns on a movable stage.

16. The method of claim 15 further comprising:
detecting secondary electrons emitted from the manufactured substrate using detectors within the columns of the array of columns.

17. The method of claim 15 further comprising:
selectively blanking electron beams of the array of electron beams so as to write a pattern onto a layer of the manufactured substrate.

18. An array of electron beam columns comprising:
a magnetic material positioned in a large-scale magnetic field;
an array of bores through the magnetic material, wherein each bore in the array of bores has a first end and a second end;
an array of electron sources, wherein each source in the array of electron sources is configured to emit electrons into the first end of a corresponding bore in the array of bores; and
multiple electrodes arranged within each bore of the array of bores.

19. The array of electron beam columns of claim 18, wherein a size of an opening at the first end of each bore is different from a size of an opening at the second end.

20. The array of electron beam columns of claim 18, wherein the magnetic material comprises a flux by-pass plate between two poles that form the large-scale magnetic field.

21. The array of electron beam columns of claim 18, wherein the magnetic material comprises one of two poles that form the large-scale magnetic field.

* * * * *